(12) United States Patent
Wang et al.

(10) Patent No.: US 6,841,473 B1
(45) Date of Patent: Jan. 11, 2005

(54) MANUFACTURING AN INTEGRATED CIRCUIT WITH LOW SOLUBILITY METAL-CONDUCTOR INTERCONNECT CAP

(75) Inventors: Pin-Chin Connie Wang, Menlo Park, CA (US); Steven C. Avanzino, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/672,126

(22) Filed: Sep. 26, 2003

Related U.S. Application Data

(62) Division of application No. 10/016,024, filed on Dec. 12, 2001, now Pat. No. 6,657,303.
(60) Provisional application No. 60/256,419, filed on Dec. 18, 2000.

(51) Int. Cl.[7] .............................................. H01L 21/44
(52) U.S. Cl. ....................... 438/661; 438/622; 438/625; 438/633; 438/687
(58) Field of Search .......................... 438/622, 624–629, 438/631, 633, 635, 637–640, 660–661, 687

(56) References Cited

U.S. PATENT DOCUMENTS

| | | | | |
|---|---|---|---|---|
| 6,358,840 B1 | * | 3/2002 | Wang et al. | 438/631 |
| 6,387,806 B1 | * | 5/2002 | Wang et al. | 438/687 |
| 6,525,425 B1 | * | 2/2003 | Woo et al. | 257/758 |
| 6,566,262 B1 | * | 5/2003 | Rissman et al. | 438/687 |

* cited by examiner

*Primary Examiner*—Carl Whitehead, Jr.
*Assistant Examiner*—Thanhha Pham
(74) *Attorney, Agent, or Firm*—Mikio Ishimaru

(57) ABSTRACT

A manufacturing method for an integrated circuit is provided having a semiconductor substrate with a semiconductor device. A device dielectric layer formed on the semiconductor substrate. A channel dielectric layer on the device dielectric layer has an opening formed therein. A barrier layer lines the channel opening. A conductor core fills the opening over the barrier layer. A cerium-conductor interconnect cap is disposed over the conductor core with a capping layer over the dielectric layer and the cerium-conductor interconnect cap.

12 Claims, 2 Drawing Sheets

MANUFACTURING AN INTEGRATED CIRCUIT WITH LOW SOLUBILITY METAL-CONDUCTOR INTERCONNECT CAP

CROSS-REFERENCE TO RELATED APPLICATION(S)

This is a divisional application of application Ser. No. 10/016,024, filed Dec. 12, 2001, now U.S. Pat. No. 6,657,503, which claims the benefit of U.S. Provisional patent application serial No. 60/256,419 filed Dec. 18, 2000.

TECHNICAL FIELD

The present invention relates generally to semiconductor technology and more specifically to an interconnect cap in an integrated circuit.

BACKGROUND ART

In the manufacture of integrated circuits, after the individual devices such as the transistors have been fabricated in and on the semiconductor substrate, they must be connected together to perform the desired circuit functions. This interconnection process is generally called "metallization" and is performed using a number of different photolithographic, deposition, and removal techniques.

In one interconnection process, which is called a "dual damascene" technique, two channels of conductor materials are separated by interlayer dielectric layers in vertically separated planes perpendicular to each other and interconnected by a vertical connection, or "via", at their closest point. The dual damascene technique is performed over the individual devices which are in a device dielectric layer with the gate and source/drain contacts extending up through the device dielectric layer to contact one or more channels in a first channel dielectric layer.

The first channel formation of the dual damascene process starts with the deposition of a thin first channel stop layer. The first channel stop layer is an etch stop layer which is subject to a photolithographic processing step which involves deposition, patterning, exposure, and development of a photoresist, and an anisotropic etching step through the patterned photoresist to provide openings to the device contacts. The photoresist is then stripped. A first channel dielectric layer is formed on the first channel stop layer. Where the first channel dielectric layer is of an oxide material, such as silicon oxide ($SiO_2$), the first channel stop layer is a nitride, such as silicon nitride (SiN), so the two layers can be selectively etched.

The first channel dielectric layer is then subject to further photolithographic process and etching steps to form first channel openings in the pattern of the first channels. The photoresist is then stripped.

An optional thin adhesion layer is deposited on the first channel dielectric layer and lines the first channel openings to ensure good adhesion of subsequently deposited material to the first channel dielectric layer. Adhesion layers for copper (Cu) conductor materials are composed of compounds such as tantalum nitride (TaN), titanium nitride (TiN), or tungsten nitride (WN).

These nitride compounds have good adhesion to the dielectric materials and provide good barrier resistance to the diffusion of copper from the copper conductor materials to the dielectric material. High barrier resistance is necessary with conductor materials such as copper to prevent diffusion of subsequently deposited copper into the dielectric layer, which can cause short circuits in the integrated circuit.

However, these nitride compounds also have relatively poor adhesion to copper and relatively high electrical resistance.

Because of the drawbacks, pure refractory metals such as tantalum (Ta), titanium (Ti), or tungsten (W) are deposited on the adhesion layer to line the adhesion layer in the first channel openings. The refractory metals are good barrier materials, have lower electrical resistance than their nitrides, and have good adhesion to copper.

In some cases, the barrier material has sufficient adhesion to the dielectric material that the adhesion layer is not required, and in other cases, the adhesion and barrier material become integral. The adhesion and barrier layers are often collectively referred to as a "barrier" layer herein.

For conductor materials such as copper, which are deposited by electroplating, a seed layer is deposited on the barrier layer and lines the barrier layer in the first channel openings to act as an electrode for the electroplating process. Processes such as electroless, physical vapor, and chemical vapor deposition are used to deposit the seed layer.

A first conductor material is deposited on the seed layer and fills the first channel opening. The first conductor material and the seed layer generally become integral, and are often collectively referred to as the conductor core when discussing the main current-carrying portion of the channels.

A chemical-mechanical polishing (CMP) process is then used to remove the first conductor material, the seed layer, and the barrier layer above the first channel dielectric layer to form the first channels. When a layer is placed over the first channels as a final layer, it is called a "capping" layer and a "single" damascene process is completed. When the layer is processed further for placement of additional channels over it, the layer is a via stop layer.

The via formation step of the dual damascene process starts with the deposition of a thin via stop layer over the first channels and the first channel dielectric layer. The via stop layer is an etch stop layer which is subject to photolithographic processing and anisotropic etching steps to provide openings to the first channels. The photoresist is then stripped.

A via dielectric layer is formed on the via stop layer. Again, where the via dielectric layer is of an oxide material, such as silicon oxide, the via stop layer is a nitride, such as silicon nitride, so the two layers can be selectively etched. The via dielectric layer is then subject to further photolithographic process and etching steps to form the pattern of the vias. The photoresist is then stripped.

A second channel dielectric layer is formed on the via dielectric layer. Again, where the second channel dielectric layer is of an oxide material, such as silicon oxide, the via stop layer is a nitride, such as silicon nitride, so the two layers can be selectively etched. The second channel dielectric layer is then subject to further photolithographic process and etching steps to simultaneously form second channel and via openings in the pattern of the second channels and the vias. The photoresist is then stripped.

An optional thin adhesion layer is deposited on the second channel dielectric layer and lines the second channel and the via openings.

A barrier layer is then deposited on the adhesion layer and lines the adhesion layer in the second channel openings and the vias.

Again, for conductor materials such as copper and copper alloys, a seed layer is deposited by electroless deposition on the barrier layer and lines the barrier layer in the second channel openings and the vias.

A second conductor material is deposited on the seed layer and fills the second channel openings and the vias.

A CMP process is then used to remove the second conductor material, the seed layer, and the barrier layer above the second channel dielectric layer to form the first channels. When a layer is placed over the second channels as a final layer, it is called a "capping" layer and the "dual" damascene process is completed.

The layer may be processed further for placement of additional levels of channels and vias over it. Individual and multiple levels of single and dual damascene structures can be formed for single and multiple levels of channels and vias, which are collectively referred to as "interconnects".

The use of the single and dual damascene techniques eliminates metal etch and dielectric gap fill steps typically used in the metallization process. The elimination of metal etch steps is important as the semiconductor industry moves from aluminum (Al) to other metallization materials, such as copper, which are very difficult to etch.

A major problem with copper relates to the high mobility of copper atoms, which allow the metal to destructively migrate through different semiconductor materials. One of the significant areas of diffusion is through the capping layer from the top surface of the interconnect. This diffusion can cause short circuits to the semiconductor devices which can result in failure of the integrated circuit. There have been many different attempts to provide interconnect caps, but they have all been problematic.

Solutions to this problem has been long sought but has long eluded those skilled in the art.

DISCLOSURE OF THE INVENTION

The present invention provides a method of manufacturing an integrated circuit having a semiconductor substrate with a semiconductor device provided thereon. A dielectric layer is formed on the semiconductor substrate and a channel layer is formed on the dielectric layer with an opening formed therein. A barrier layer, with a seed layer deposited thereon, is deposited to line the channel opening. A conductor core is deposited to fill the channel opening, and is chemically-mechanically polished with the seed layer, barrier layer and dielectric layer. Thermal treatment of the low solubility metal after the chemical-mechanical polishing is performed causes alloying with the conductor in the conductor core to form a low solubility metal-conductor interconnect cap and a capping layer is formed over the dielectric layer and conductor interconnect cap. The interconnect cap is preferably of a copper-cerium alloy to prevent diffusion through the capping layer.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
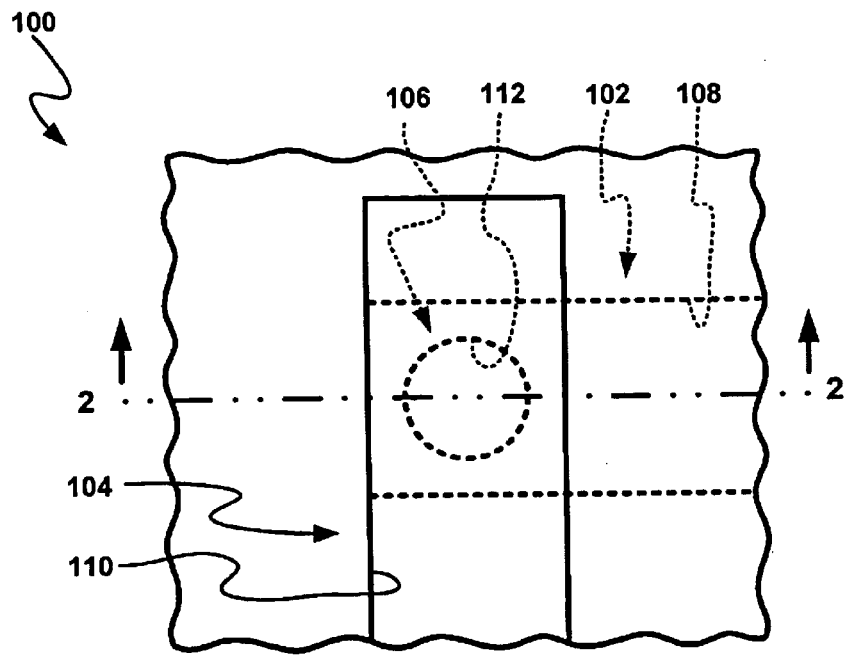
FIG. 1 (PRIOR ART) is a plan view of aligned channels with a connecting via.

Referring now to FIG. 1 (PRIOR ART), therein is shown a plan view of a semiconductor wafer 100 with a silicon semiconductor substrate (not shown) having as interconnects first and second channels 102 and 104 connected by a via 106. The first and second channels 102 and 104 are respectively disposed in first and second channel dielectric layers 108 and 110. The via 106 is an integral part of the second channel 104 and is disposed in a via dielectric layer 112.

The term "horizontal" as used in herein is defined as a plane parallel to the conventional plane or surface of a wafer, such as the semiconductor wafer 100, regardless of the orientation of the wafer. The term "vertical" refers to a direction perpendicular to the horizontal as just defined. Terms, such as "on", "above", "below", "side" (as in "sidewall"), "higher", "lower", "over", and "under", are defined with respect to the horizontal plane.

Figure 2:
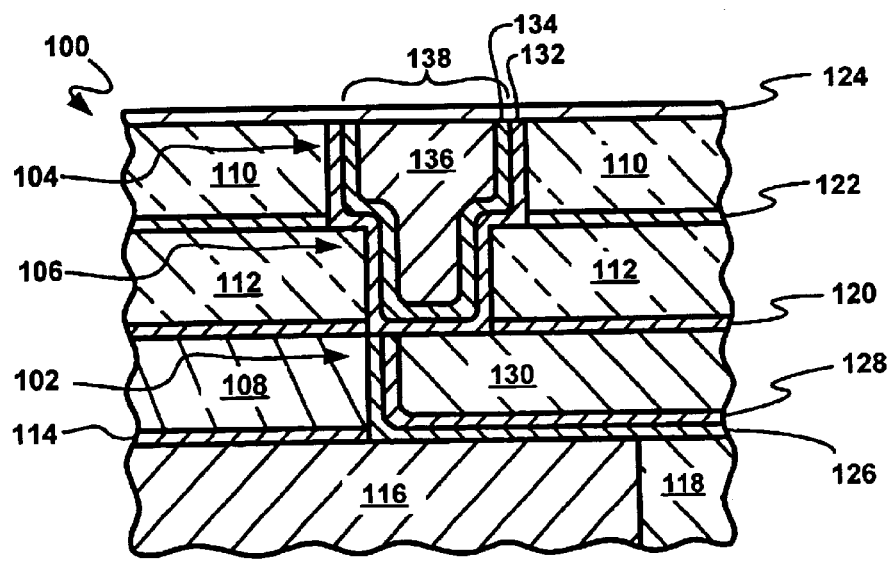
FIG. 2 (PRIOR ART) is a cross-section of FIG. 1 (PRIOR ART) along line 2—2.

Referring now to FIG. 2 (PRIOR ART), therein is shown a cross-section of FIG. 1 (PRIOR ART) along line 2—2. A portion of the first channel 102 is disposed in a first channel stop layer 114 and is on a device dielectric layer 116, which is on the silicon semiconductor substrate. Generally, metal contacts are formed in the device dielectric layer 116 to connect to an operative semiconductor device (not shown). This is represented by the contact of the first channel 102 with a semiconductor contact 118 embedded in the device dielectric layer 116. The various layers above the device dielectric layer 116 are sequentially: the first channel stop layer 114, the first channel dielectric layer 108, a via stop layer 120, the via dielectric layer 112, a second channel stop layer 122, the second channel dielectric layer 110, and a next channel stop or capping layer 124 (not shown in FIG. 1).

The first channel 102 includes a barrier layer 126, which could optionally be a combined adhesion and barrier layer, and a seed layer 128 around a conductor core 130. The second channel 104 and the via 106 include a barrier layer 132, which could also optionally be a combined adhesion and barrier layer, and a seed layer 134 around a conductor core 136. The barrier layers 126 and 132 are used to prevent diffusion of the conductor materials into the adjacent areas of the semiconductor device. The seed layers 128 and 134 form electrodes on which the conductor material of the conductor cores 130 and 136 are deposited. The seed layers 128 and 134 are of substantially the same conductor material as the conductor cores 130 and 136 and become part of the respective conductor cores 130 and 136 after the deposition.

The capping layer 124 is placed over the second channel dielectric layer 110 and the second channel 104 to protect their exposed surfaces. However, with conductor materials such as copper, due to the high mobility of copper atoms, it is possible for copper diffusion through the capping layer 124 in the region 138 from the top surface of the interconnect which is the second channel 104. This diffusion can cause short circuits to the semiconductor devices which can result in failure of the integrated circuit.

Figure 3:
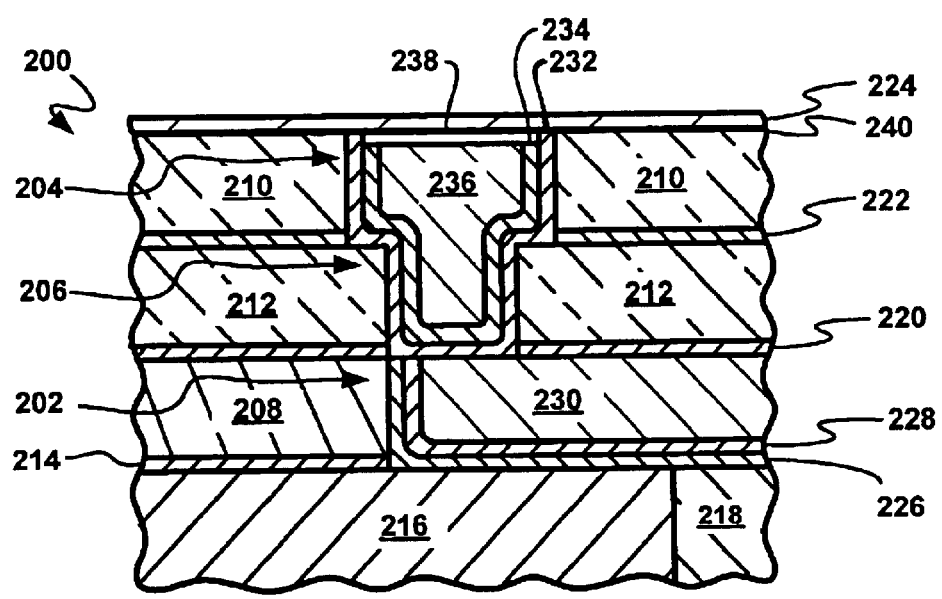
FIG. 3 is a cross-section similar to FIG. 2 (PRIOR ART) showing the interconnect cap of the present invention.

Referring now to FIG. 3, therein is shown a cross-section similar to that shown in FIG. 2 (PRIOR ART) of a semiconductor wafer 200 of the present invention. The semiconductor wafer 200 has first and second channels 202 and 204 connected by a via 206. The first and second channels 202 and 204 are respectively disposed in first and second dielectric layers 208 and 210. The via 206 is a part of the second channel 204 and is disposed in a via dielectric layer 212.

A portion of the first channel 202 is disposed in a first channel stop layer 214 and is on a device dielectric layer 216. Generally, metal contacts (not shown) are formed in the device dielectric layer 216 to connect to an operative semiconductor device (not shown). This is represented by the contact of the first channel 202 with a semiconductor device gate 218 embedded in the device dielectric layer 216. The various layers above the device dielectric layer 216 are sequentially: the first channel stop layer 214, the first channel dielectric layer 208, a via stop layer 220, the via dielectric layer 212, a second channel stop layer 222, the second channel dielectric layer 210, and a next channel stop layer or capping 224.

The first channel 202 includes a barrier layer 226 and a seed layer 228 around a conductor core 230. The second channel 204 and the via 206 include a barrier layer 232 and a seed layer 234 around a conductor core 236. The barrier layers 226 and 232 are used to prevent diffusion of the conductor materials into the adjacent areas of the semiconductor device. The seed layers 228 and 234 form electrodes on which the conductor material of the conductor cores 230 and 236 are deposited. The seed layers 228 and 234 are of substantially the same conductor material of the conductor cores 230 and 236 and become part of the respective conductor cores 230 and 236 after the deposition.

In the present invention, an interconnect cap 238 is shown over the conductor core 236 and the seed layer 234. The interconnect cap 238 is under the capping layer 224 and is a copper-cerium, copper-yittrium, copper-zirconium, or similar intermetallic compound which acts as a barrier to stop diffusion through the capping layer 224.

The interconnect cap 238 is manufactured by a process which includes chemical-mechanical polishing (CMP) using a slurry to planarize the conductor core 236, the seed layer 234, and the barrier layer 232 with the second channel dielectric layer 210. The slurry can contain cerium oxide as an abrasive. Alternatively, the interconnect cap 238 is manufactured by immersing or applying metal complex solutions of oxides of cerium, yittrium, zirconium, or other low solubility metal which forms an intermetallic compound with the conductor core 236 and a strong oxide metal. It has been found that the preferred low solubility metals have low solid solubility in copper and a metal oxide that is more stable than silicon dioxide. These low solubility metal oxides are left or added on the top surface of the second channel dielectric layer 210 and the second channel 204.

Thus, the term "low solubility metal" is defined for the purposes of the present invention as a metal having a solid solubility in a conductor metal of less than 0.1 atomic % at room temperature. The term "strong oxide metal" is defined for the purposes of the present invention as a metal which forms a metal oxide that is more stable than silicon dioxide.

Using ceria (cerium oxide) or its complex molecule and copper conductor as a specific example, the cerium is bonded with copper or the oxidized copper surface. In addition, there are other complex molecules containing carbon, nitrogen absorbed on the copper, or oxidized copper. The cerium may be in an oxide or hydroxide form with from one to three monolayers of absorption.

To improve the process a cleaning step, such as a "reduction" treatment, is used to reduce the copper oxide, remove the organic residues, and reduce the low solubility metal hydroxide. The reduction treatment includes using a reducing plasma containing nitrogen and hydrogen, ammonia, or other reducing agents.

The reduction process does not have to leave the low solubility metal continuous over the conductor material because a thermal treatment can then be used to form the intermetallic compound by a thermal anneal from about 150° C. to about 450° C. for up to several hours followed by cooling treatment.

The thermal treatment has an additional benefit in that many dielectric materials contain oxide bonds and the treatment will cause the low solubility metals to form stable oxides with these oxide bonds so as to form an additional capping layer 240 under the capping layer 224.

Finally, the capping layer 224 will be deposited over the second channel dielectric layer 210, the barrier layer 232, and the interconnect cap 238.

In various embodiments, the diffusion barrier layers are of materials such as tantalum (Ta), titanium. (Ti), tungsten (W), alloys thereof, and compounds thereof. The seed layers (where used) are of materials such as copper (Cu), gold (Au), silver (Ag), alloys thereof, and compounds thereof with one or more of the above elements. The conductor cores with or without seed layers are of conductor materials such as copper, aluminum (Al), gold, silver, alloys thereof, and compounds thereof. The dielectric layers are of dielectric materials such as silicon oxide ($SiO_x$), tetraethoxysilane (TEOS), borophosphosilicate (BPSG) glass, etc. with dielectric constants from 4.2 to 3.9 or low dielectric constant dielectric materials such as fluorinated tetraethoxysilane (FTEOS), hydrogen silsesquioxane (HSQ), benzocyclobutene (BCB), TMOS (tetramethoxysilane), OMCTS (octamethyleyclotetrasiloxane), HMDS (hexamethyldisiloxane), SOB (trimethylsilil borxle), DADBS (diaceloxyditerliarybutoxsilane), SOP (trimethylsilil phosphate), etc. with dielectric constants below 3.9. The stop layers and capping layers (where used) are of materials such as silicon nitride ($Si_xN_x$) or silicon oxynitride (SiON).

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method of manufacturing an integrated circuit comprising the steps of:

providing a semiconductor substrate having a semiconductor device provided thereon;

forming a dielectric layer on the semiconductor substrate;

forming an opening in the dielectric layer;

depositing a conductor core to fill the opening and connect to the semiconductor device;

planarization of the conductor core and the dielectric layer;

providing a low solubility metal oxide on the conductor core and the dielectric layer, thermally treating of the low solubility metal oxide to cause alloying of the low solubility metal with the conductor in the conductor core to form a low solubility metal-conductor interconnect cap over the conductor core; and forming a capping layer over the low solubility metal-conductor interconnect cap and the dielectric layer.

2. The method of manufacturing an integrated circuit as claimed in claim 1 wherein thermally treating is performed from about 150° C. to about 450° C.

3. The method of manufacturing an integrated circuit as claimed in claim 1 including reduction treating the low solubility metal oxide after providing the low solubility metal oxide.

4. The method of manufacturing an integrated circuit as claimed in claim 1 wherein providing the low solubility metal oxide provides a stable oxide of a low solubility metal having a low solid solubility in the conductor core material to form an intermetallic compound therewith.

5. The method of manufacturing an integrated circuit as claimed in claim 1 wherein providing the low solubility metal oxide provides a low solubility metal selected from a group consisting of cerium, lanthanum, zirconium, a compound thereof, and a combination thereof.

6. The method of manufacturing an integrated circuit as claimed in claim 1 wherein depositing the conductor core deposits a material selected from a group consisting of copper, aluminum, gold, silver, an alloy thereof, and a compound thereof.

7. A method of manufacturing an integrated circuit comprising the steps of:

provided a semiconductor substrate having a semiconductor device provided thereon;

forming a device dielectric layer over the semiconductor substrate;

forming a channel dielectric layer over the device dielectric layer;

forming a channel opening in the channel dielectric layer;

depositing a barrier layer to line the channel opening;

depositing a seed layer to line the barrier layer;

depositing a conductor core to fill the channel opening and connect to the semiconductor device;

chemical-mechanical polishing of the conductor core, the seed layer, the barrier layer, and the dielectric layer;

providing a low solubility metal oxide on the conductor core, the seed layer, the barrier layer, and the dielectric layer;

thermally treating of the low solubility metal oxide to cause alloying of the low solubility metal with the conductor in the conductor core to form a low solubility metal-conductor interconnect cap over the conductor core; and forming a capping layer over the dielectric layer and the low solubility metal-conductor interconnect cap.

8. The method of manufacturing an integrated circuit as claimed in claim 7 wherein thermally treating the low solubility metal oxide is performed from about 150° C. to about 450° C. for up to three hours followed by a cooling treatment.

9. The method of manufacturing an integrated circuit as claimed in claim 7 including reduction treating the low solubility metal oxide after providing the low solubility metal oxide using a reducing plasma.

10. The method of manufacturing an integrated circuit as claimed in claim 7 wherein providing the low solubility metal oxide provides a stable oxide of a low solubility metal having a low solid solubility in the conductor core material to form an intermetallic compound therewith.

11. The method of manufacturing an integrated circuit as claimed in claimed 7 wherein the low solubility metal oxide provides a low solubility metal selected from a group consisting of cerium, lanthanum, zirconium, a compound thereof, and a combination thereof.

12. The method of manufacturing an integrated circuit as claimed in claimed 7 wherein depositing the conductor core deposits a material selected from a group consisting of copper, aluminum, gold, silver, an alloy thereof, and a compound thereof.

* * * * *